United States Patent

Bianca et al.

[11] Patent Number: 6,051,781
[45] Date of Patent: *Apr. 18, 2000

[54] SURFACE MOUNT ELECTROMAGNETIC FREQUENCY INTERFERENCE SHIELD CLIP

[75] Inventors: Giuseppe Bianca, Temecula; Joseph J. Lynch, San Marcos, both of Calif.; Timothy Stephany, Mpls, Minn.; Robert M. Bogursky, Encinitas, Calif.

[73] Assignee: Autosplice, Inc., San Diego, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/936,866

[22] Filed: Sep. 24, 1997

[51] Int. Cl.[7] ........................................................ H05K 9/00
[52] U.S. Cl. ........................ 174/35 C; 361/818; 361/816; 361/800; 361/753
[58] Field of Search ................................ 174/35 R, 35 C, 174/35 GC; 361/816, 818, 800, 753

[56] References Cited

U.S. PATENT DOCUMENTS

| | | | |
|---|---|---|---|
| 5,250,751 | 10/1993 | Yamaguchi | 174/35 GC |
| 5,311,408 | 5/1994 | Ferchau et al. | 361/818 |
| 5,343,361 | 8/1994 | Rudy, Jr. et al. | 361/710 |
| 5,354,951 | 10/1994 | Lange, Sr. et al. | 174/35 R |
| 5,545,843 | 8/1996 | Arviddson et al. | 174/35 GC |
| 5,600,092 | 2/1997 | Patscheck et al. | 174/35 GC |
| 5,709,574 | 1/1998 | Bianca et al. | 439/858 |

*Primary Examiner*—William A. Cuchlinski, Jr.
*Assistant Examiner*—Ronnie Mancho
*Attorney, Agent, or Firm*—Michael H. Jester

[57] ABSTRACT

A unitary metal clip is stamped from a flat strip of sheet metal which is bent to provide two pairs of generally V-shaped fingers which extend upwardly from a base and have opposing apexes. An L-shaped arm also extends upwardly from the base between the pairs of fingers and has a horizontal pick-up tab that is located at a height above the opposing apexes of the fingers. A pneumatic head of an automatic pick and place machine grabs the pick-up tab and removes the clip from a pocket of a supply tape unrolled from a reel. The base of the clip is positioned on a solder pad of a PC board before solder re-flow. The lower edge of the sidewall of an EMI shield may be pressed down to bend the pick-up tab downwardly and squeeze the sidewall between the apexes of the fingers.

12 Claims, 8 Drawing Sheets

SURFACE MOUNT ELECTROMAGNETIC FREQUENCY INTERFERENCE SHIELD CLIP

BACKGROUND OF THE INVENTION

The present invention relates to components utilized in the manufacture of electronic circuit boards, and more particularly, to devices for attaching enclosures to printed circuit boards for shielding the electronic circuits covered thereby from electromagnetic interference (EMI).

As used herein, EMI includes not only radio frequency interference (RFI) but electromagnetic pulses and fields which, for example, can be emitted by powerful electromagnets, permanent magnets, motors, etc. As used herein, the term EMI shall include all types of electromagnetic interference. EMI can seriously impair the operation of sensitive electronic components, such as micro-processors.

Many electronic devices, such as micro-processors, emit radio frequency (RF) electromagnetic interference energy which can interfere with or impair the proper operation of other electronic devices and systems in the same environment. This is the reason for restrictions on airlines that prohibit the operation of laptop computers during ascent and descent. Regulations concerning the operation of consumer electronic devices that emit RF signals have been implemented to reduce the possibility that there will be impairment of the sensitive guidance and communication systems on board the aircraft. Accordingly, it has long been known to cover or conceal certain electronic components on a printed circuit (PC) board with an EMI shield. It typically comprises a generally rectangular housing or enclosure made of cold rolled steel, copper or some other metal having a lid and four folded down sidewalls. In many cases the lid has a plurality of ventilation holes to facilitate cooling of the enclosed electronic component. The holes are normally dimensioned relative to the frequency of the RF signals of concern to effectively prevent transmission of the RF signals through the holes. Conversely, the proper operation of many electronic components requires that they not be exposed to certain levels of EMI from outside or external sources.

In the past, EMI shields have been manufactured in a configuration principally suited for mounting on conventional PC boards having through-holes. Thus, these shield have had tabs and leads that have registered with corresponding through holes and which are soldered in place to register the shield over the electronic component. Clips have also been manufactured for insertion into through holes in PC boards which grasp the vertical sidewalls of an EMI shield for holding the same.

Electronic assembly and manufacture is moving more towards surface mount technology (SMT). According to this component mounting scheme, the PC board typically has no through holes and the individual electronic components, shields, clips, and other devices have legs, leads or other terminals which generally have terminal portions projecting horizontally registered with corresponding solder pads. During the re-flow process the solder pads are heated, such as by high intensity infrared radiation, so that the solder re-flows and establishes the required electrical and mechanical interconnection. During the assembly line production of surface mounted printed PC boards, automatic pick and place machines are utilized to pick up components, connectors, clips and other devices automatically fed to the same and position them in predetermined precise locations on the PC board. Most frequently, the electronic components, clips and other devices are supplied via tape and reel for pick up by a pneumatic head of the pick and place machine. This head literally sucks up the component and holds the same for transfer to the PC board.

EMI shield clips have been formed with right-angle legs to facilitate surface mounting of the clips. See for example U.S. Pat. No. 5,354,951 of Lange, Sr., et al. assigned to Leader Tech, Inc. of Tampa, Fla. That patent discloses an EMI shield consisting of a lower fence having a plurality of mounting pins which engages with and receives a removable rectangular top cover which permits component accessibility.

In one type of tape and reel, electronic components and other parts are individually stored in pockets formed in the tape. The head of the pick and place machine must reach into the pocket to remove the electronic component or part.

Existing clips for securing EMI shields to PC boards are not well suited for use with tape and reel supply and subsequent retrieval and registration by conventional pick and place machines.

SUMMARY OF THE INVENTION

A clip for attaching a structure to a substrate includes a base and at least one pair of resilient opposing fingers extending in a first direction from the base. An arm has a first leg that extends in the first direction from the base and a second leg that provides a substantially flat pick-up tab and extends in a second direction substantially orthogonal to the first direction.

BRIEF DESCRIPTION OF THE DRAWINGS

FIG. 10 illustrates the manner in which the clip of FIG. 1 may be stored in the pocket of a continuous tape reel for retrieval by the pneumatic head (not illustrated) of a pick and place machine. In FIG. 10 a portion of the tape has been enlarged to show details of the storage of the clip in a pocket of the continuous tape.

DETAILED DESCRIPTION OF THE PREFERRED EMBODIMENTS

Figure 1:
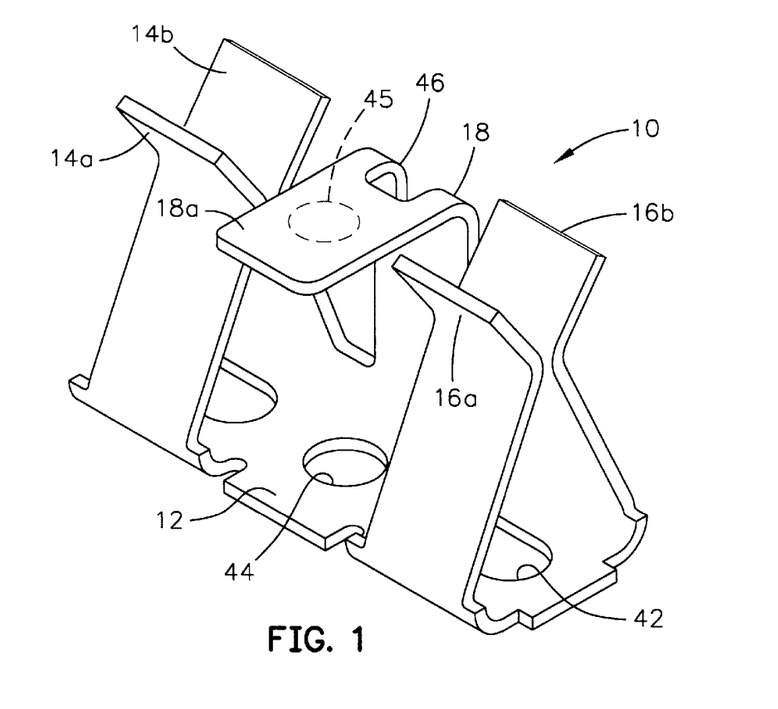
FIG. 1 is an isometric view of a preferred embodiment of the EMI interference shield clip of the present invention.

Referring to FIG. 1, a clip 10 is illustrated which is configured for attaching an EMI shield to a substrate in the form of a PC board utilizing SMT. The clip 10 is preferably manufactured through continuous stamping and bending of a sheet metal strip, as explained hereafter in further detail. The metal can be cold rolled steel, copper, or any other metal which is easy to stamp and bend and which is readily solderable. The clip 10 includes a generally rectangular, elongate flat base 12 and pairs 14a, 14b, 16a, 16b of opposing V-shaped fingers which extend generally vertically from opposite ends of the base 12. An inverted L-shaped arm 18 extends vertically from the base 12 between the pairs of fingers. The arm 18 includes a generally horizontally extending pick-up tab 18a. The pick-up tab 18a extends over and above the base 12.

Figure 3:
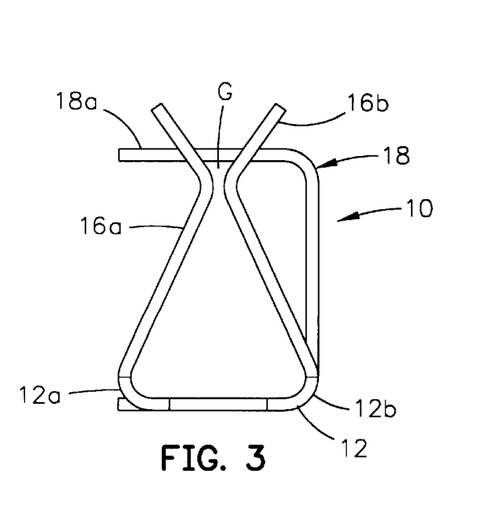
FIG. 3 is an end view of the clip of FIG. 1.
Figure 4:
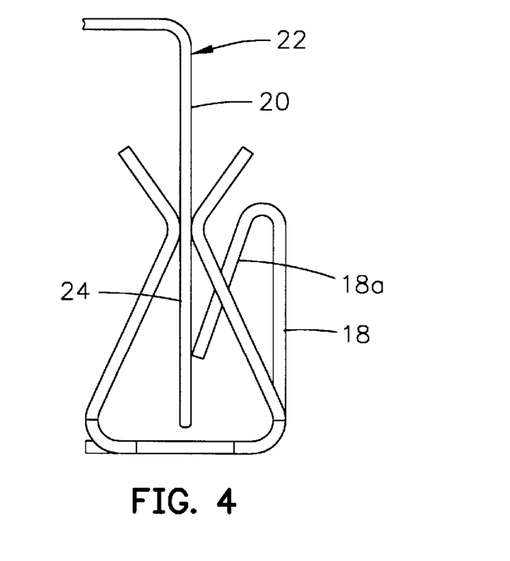
FIG. 4 is an end view of FIG. 1 after the clip has received the sidewall of an EMI shield.
Figure 5:
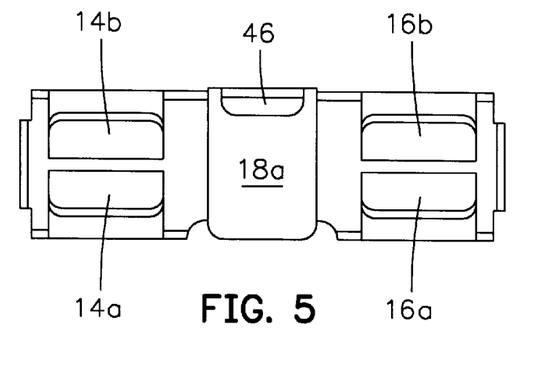
FIG. 5 is a slightly reduced top plan view of the clip of FIG. 1.
Figure 6:
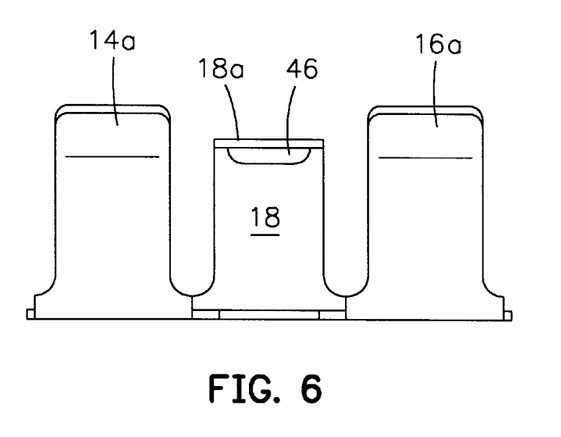
FIG. 6 is a slightly reduced side elevation view of the clip of FIG. 1.
Figure 7:
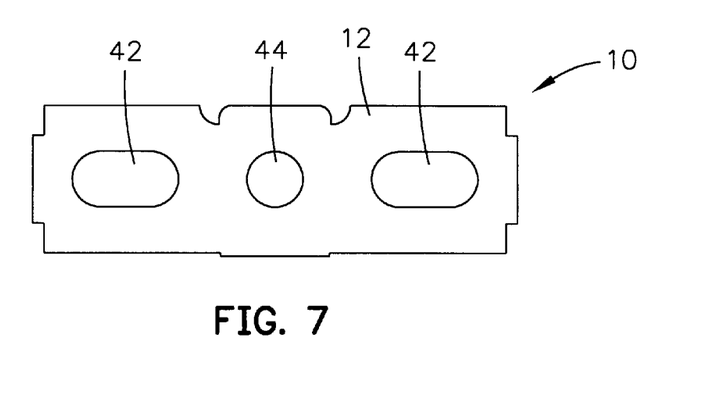
FIG. 7 is a slightly reduced bottom view of the clip of FIG. 1.

The configuration of the fingers 14a and 14b and their relationship is identical to the configuration and relationship of the fingers 16a and 16b. Accordingly, only the latter need to be described. Referring to FIG. 3 and to FIGS. 5–8, the fingers 16a and 16b converge toward one another moving away from the base 12 before diverging away from one another. The apexes of the fingers 16a and 16b are closely spaced, but do not contact one another. More particularly, a gap G in FIG. 3, exists between the apexes of the two opposing fingers 16a and 16b. As best seen in FIG. 4, when a downwardly extending vertical sidewall 20 of an EMI shield 22 is inserted between the fingers 16a and 16b, through the gap G, the fingers 16a and 16b separate slightly to accept the legs 20. The gap G has a thickness slightly less than a thickness of the sidewall. Due to the resilience of the metal fingers 16a and 16b, they spring back and press against the sidewall 20.

When the sidewall 20 is inserted between the fingers 16a and 16b, the pick-up tab 18a is bent downwardly as shown in FIG. 4. The terminal end of the pick-up tab 18a registers the lower edge of a hole or notch 24 in the sidewall 20 of the EMI shield. The sidewall is thus locked in position in the clip 10 and cannot be withdrawn unless a shim (not illustrated) is inserted between the sidewall 20 and the pick-up tab 18a to push it out of registration with the lower edge of the notch 24.

Figure 2:
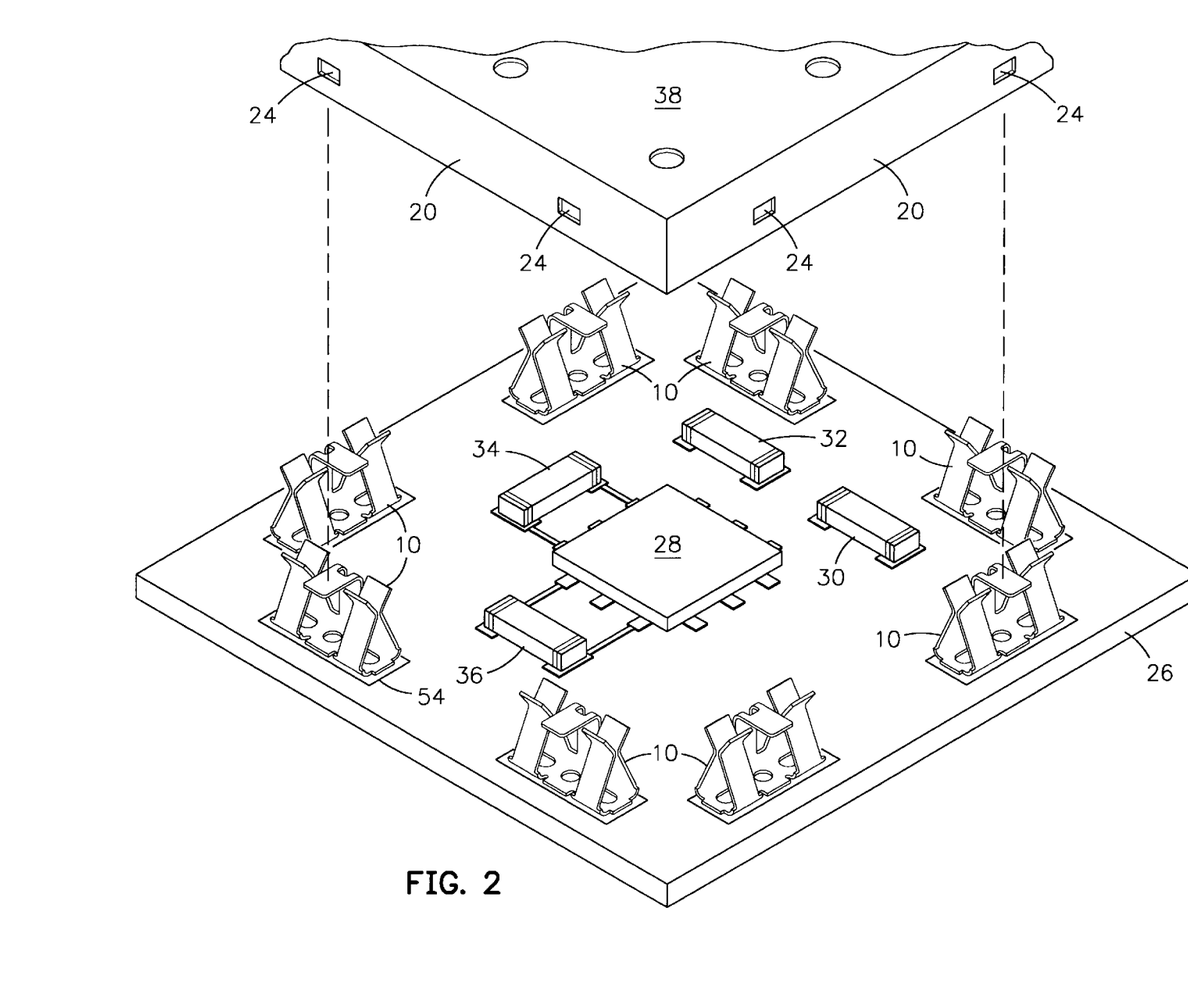
FIG. 2 is an isometric view of a PC board with a plurality of clips of the type illustrated in FIG. 1 surface mounted on the same for securing an EMI shield to the PC board thereby enclosing a plurality of electronic components also surface mounted on the PC board.

FIG. 2 illustrates a substrate in the form of a PC board 26 having a microprocessor 28 and a plurality of peripheral electronic components 32, 34, and 36 surface mounted on the top surface thereof. Eight clips 10 of the type illustrated in FIG. 1 are surface mounted around the microprocessor 28 on the top surface of the PC board 26. The four sidewalls 20 of the EMI shield 22 can be inserted between the fingers 14a, 14b and 16a, 16b of the clips 10 for locking the same in position on the top surface of the PC board 26 to thereby enclose the microprocessor 28 and components 30, 32, 34 and 36. This protects the microprocessor and the other components from external sources of EMI. Furthermore, it prevents EMI emitted by the microprocessor 28 and other components from traveling away from the PC board and interfering with adjacent electronic equipment. The cover or lid 38 of the EMI shield 22 is formed with a plurality of ventilation holes 40. The diameter of these holes 40 is selected relative to the wavelength of any RF emissions from within the shield so that it will not effectively pass through the holes.

The base 12 (FIG. 7) of the clip 10 is formed with two oval shaped holes 42 at opposite ends thereof and an intermediate round hole 44. If desired, a hole 45 shown in lines in FIG. 1 may be formed in the pick-up tab 18a for registration with the hole 44. A hole 46 is also formed in the L-shaped arm 18 where it is bent at a right angle.

The pick-up tab 18a is an important feature of the clip 10. It temporarily supports the lower bottom edges of the sidewalls 20 of the EMI shield 22 when they are initially laid on top of the clip between the diverging segments of the fingers 14a, 14b, 16a, and 16b. This permits minute adjustments in the position of the shield 22 before the sidewalls are further depressed to deflect the pick-up tab 18a and lock the sidewalls in position, as shown in FIG. 4. It is important to note that the diverging segments of the opposing fingers also provide convenient guides for registering the sidewalls. The pick-up tab 18a provides a surface which is readily contacted and locked on to by the pneumatic head (not illustrated) of a conventional pick and place machine.

Figure 10:
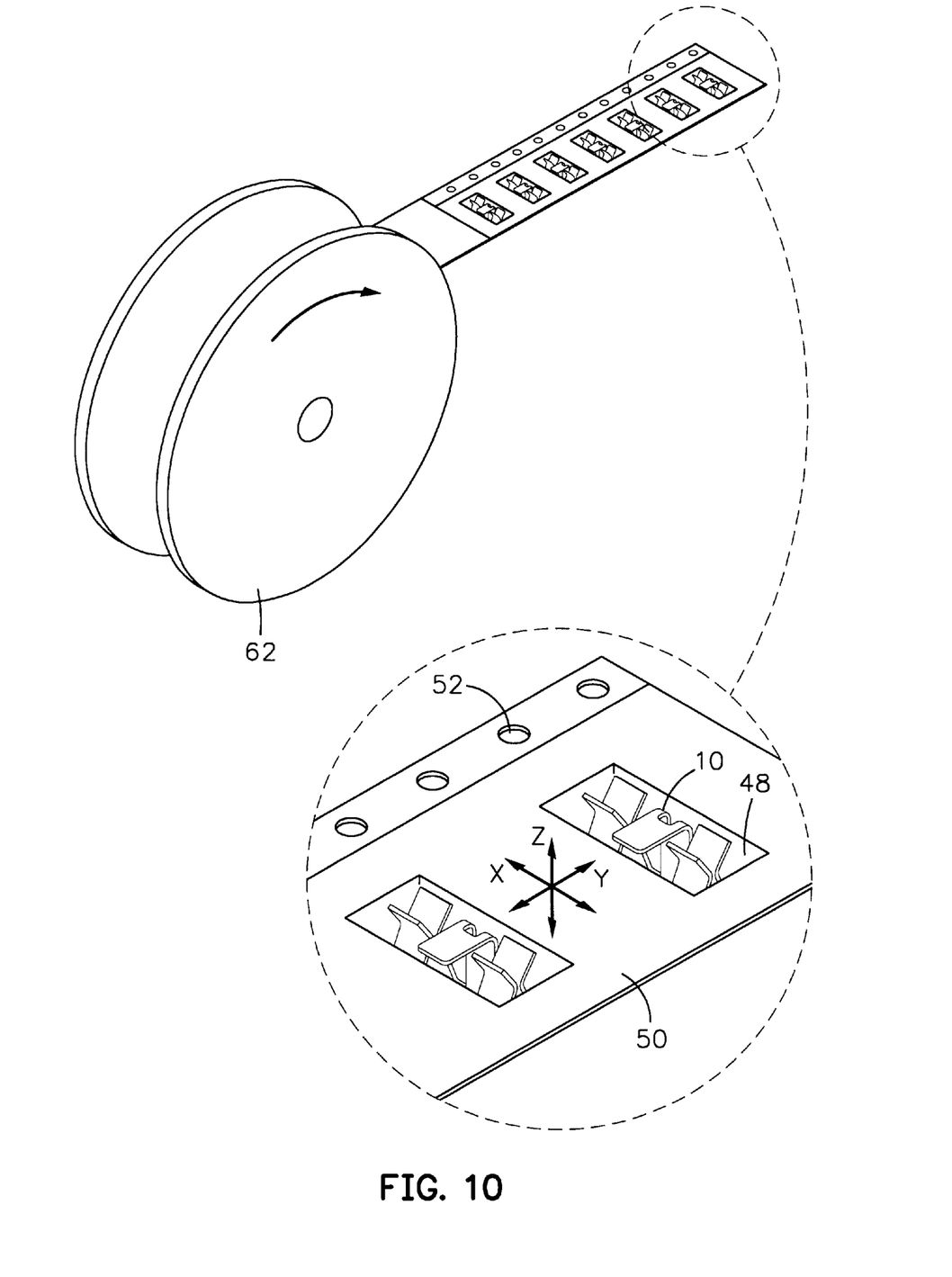

As best seen in FIG. 10, each clip 10 is stored in an upwardly opening pocket 48 formed in a plastic carrier tape 50. The plastic carrier tape 50 has a series of holes 52 formed along one side edge thereof for driving through a feeder mechanism (not illustrated) installed in a pick and place machine. The tape 50 normally has a top cover layer (not illustrated) adhesively attached to the same for holding the clips 10 in position. The tape 50, with the clips 10 stored therein, and the cover layer in place, is unwound from a supply reel 52 in the feeder. The feeder peels back the top cover layer and the pneumatic head (not illustrated) of the pick and place machine grips the pick-up tab 18a of each clip 10, in succession, via suction, to lift the same from its corresponding pocket 48 in the tape 50. The clip 10 is then transferred to the adjacent PC board 26 where it is deposited onto a solder pad 54. After all of the clips 10, microprocessor 28, and other components 30, 32, 34 and 36 are placed onto the upper surface of the PC board, the same goes through a solder station where the solder pads on top of which all the components rest, are heated by high intensity infrared lamps, or other sources. The solder reflows to provide the required mechanical and electrical interconnections when the solder solidifies.

Figure 8:
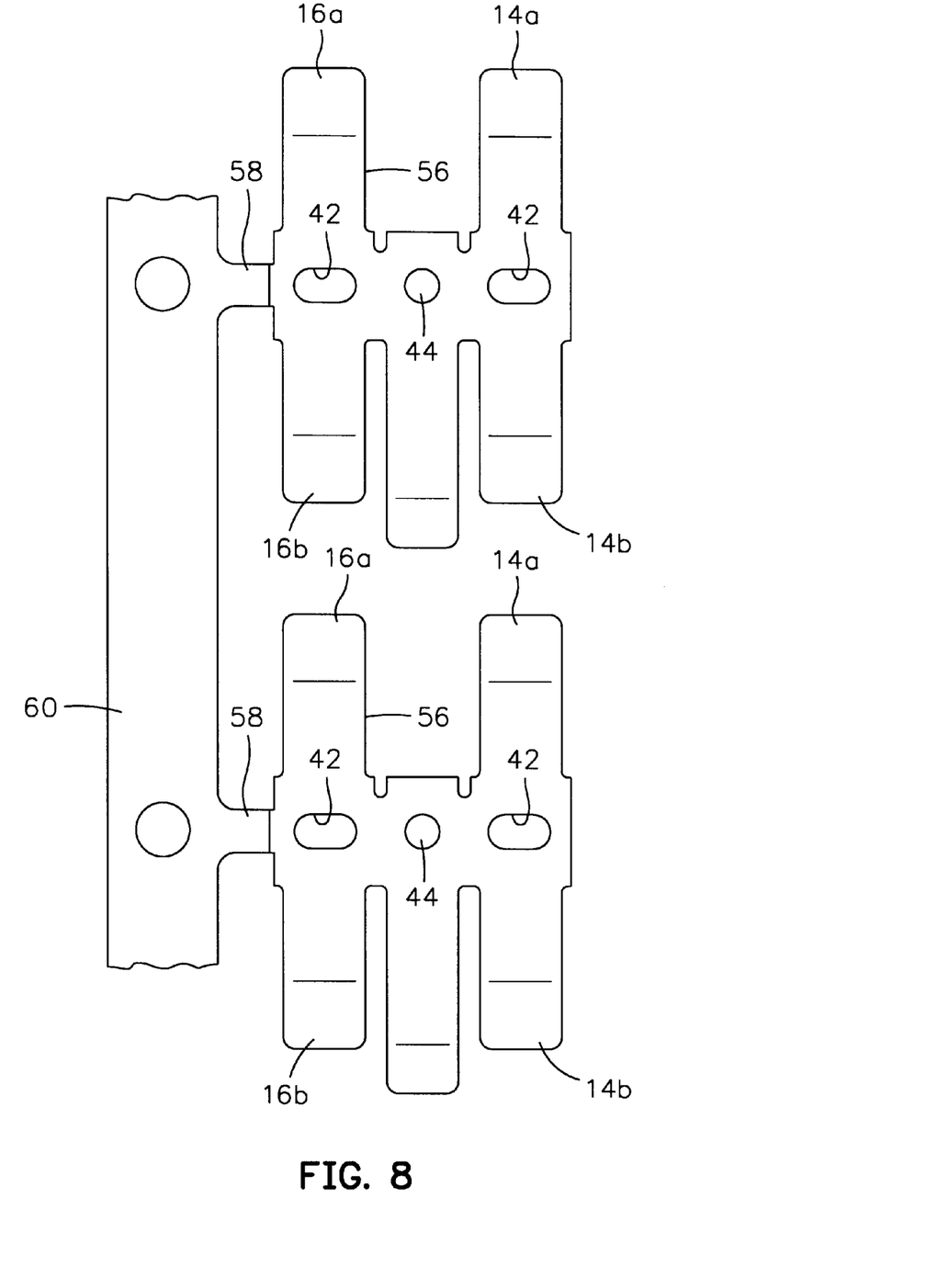
FIG. 8 illustrates a step in the continuous manufacture of the clip of FIG. 1.
Figure 9:
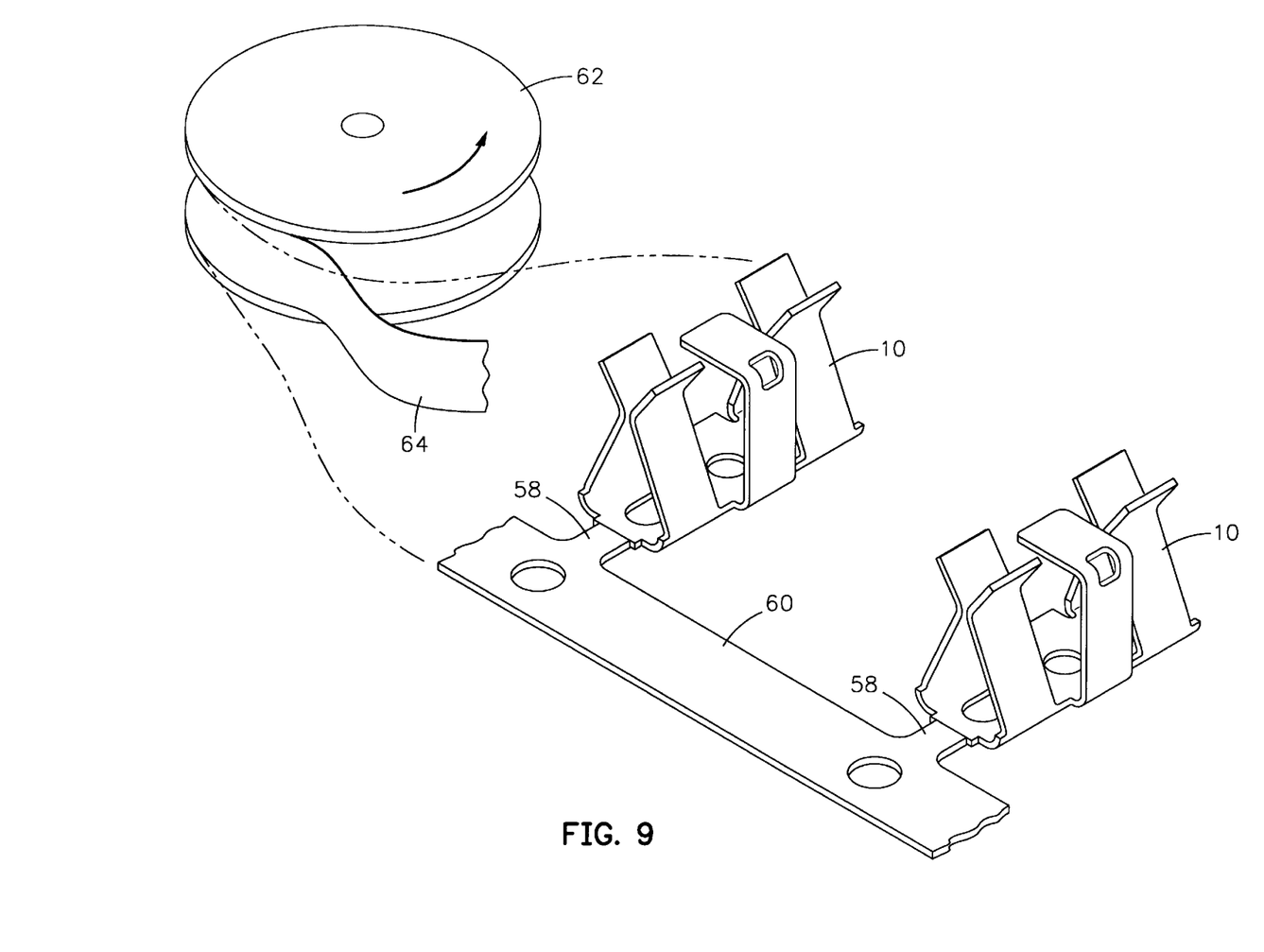
FIG. 9 illustrates another step in the continuous manufacture of the clip of FIG. 1.

FIGS. 8 and 9 illustrate successive stages in the manufacture of the clips 10. A ribbon or web of appropriate sheet metal is first conveyed through a series of stamping machines to create flat frames such as 56 (FIG. 8) which are attached by flanges 58 to a carrier strip 60. Each frame 56 defines the opposing fingers 14a, 14b, 16a, 16b, attached to the base 12. In addition, the stamping operations also form the holes 42, 44 and 46. The carrier strip 60 is used to propel the series of frames 56 through various bending operations to form the clips 10 as illustrated in FIG. 9. FIG. 9 also illustrates a reel 62 from which a continuous web or ribbon 64 is unwound, and passed through various punching and stamping operations to form the frames 56, flanges 58 and carrier strip 60 before the frames 56 are ultimately bent into the clips 10. The carrier strip 60 is ultimately passed through a sheer which cuts the flange 58 off from each frame 10 to separate the same from the carrier strip 60. The frames 10 are installed in the upwardly opening pockets 48 of the plastic carrier tape 50 (FIG. 10). The cover strip (not illustrated) is then adhesively applied to the top layer of the carrier tape 50 to hold the finished clips 10 in position. The carrier tape 50 is wrapped around the reel 52 before shipment to a customer for installation on a feeder of an automatic pick and place machine.

Figure 11:
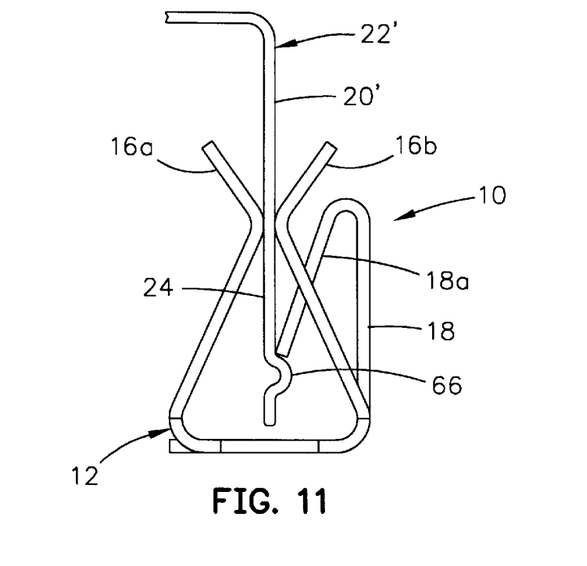
FIG. 11 illustrates the manner in which the clip of FIG. 1 can be utilized with EMI shields having bumps on the sidewalls thereof, in lieu of notches to provide an optional lockdown feature.

FIG. 11 illustrates the manner in which the clip 10 can also be used with an alternate form of EMI shield 22' in which the vertical sidewalls 20' are provided with a dimple or bump 66 in lieu of the registration notches 24. When the sidewalls 20' are inserted between the fingers, such as 16a and 16b of the clip 10, they deflect the pick-up tab 18a downwardly, as previously described. However, in this case, the lower terminal end of the pick-up tab 18a deflects to allow the bump 66 to pass and then presses against the bump 66 to lock the EMI shield 22' in position.

The base 12 of the clip 10 provides stability for the clip when it is placed on its solder pad. The up turned rounded edges 12a and 12b (FIG. 3) which join the base 12 and the fingers 14a, 14b, 16a, and 16b help maximize the strength of the solder bond between the PC board 26 and the clip 10. The height of the fingers 14a, 14b, 16a and 16b is selected for optimum spring normal force and maximum deflection while providing a generous lead-in. The pick-up tab 18a is configured and dimensioned so that the head of the pick and place machine will not have to extend into the pocket 48 of the carrier tape 50. The pick-up tab 18a is located in the center of the clip 10 to provide balance. Thus the configuration of the clip 10 is suited for optimum placement speed and accuracy.

The pick-up tab 18a is deflectable, i.e., it swings out of the way when the sidewalls 20 of the EMI shield are inserted into the clip. The notches 24 and the bumps 66 on the sidewalls 20 of the EMI shield 22 are optional. The terminal end of the pick-up tab 18a will provide some degree of holding force, along with the grip of the pairs of fingers 14a, 14b, 16a and 16b. However, the use of the holes 24 or bumps 66 is preferred since it removes the possibility that the shield 22 will accidentally be removed from the PC board, such as through vibration or impact. The pick-up tab 18a, before it is bent downwardly, serves as a convenient platform for holding the lower edge of the sidewall 20 of the EMI shield 22 slightly above the apex of the fingers. This allows lateral adjustment of the location of the EMI shield 22 before pressing the same down, to lock it into position. Minimal insertion force is thus required. This reduces the potential for damage as well.

The pick-up tab 18a acts as a pre-assembly locating device. Clips which do not have this feature are limited to utilization by pick and place equipment that have the ability to move downwardly in the Z (FIG. 10) direction, i.e., move downwardly to the bottom of a pocket 48 in a carrier tape 50 for picking up the parts. The clip 10 does not require the utilization of such equipment, and instead can be utilized with pick and place machines in which the movement of the pneumatic head is restricted to the X and Y directions (FIG. 10).

To recapitulate, the present invention, in its preferred embodiment provides a metal clip for surface mounting a metal clip is provided for surface mounting via solder pad to a PC board for attaching an electromagnetic interference (EMI) shield over an electronic component such as a microprocessor. The clip is stamped from sheet metal that is folded and bent to provide a single unitary structure that may be provided in pockets of a tape and reel supply for automatic pick and placement onto the PC board. The clip has two pairs of generally V-shaped fingers which extend upwardly from a base and having opposing apexes which define a gap therebetween having a dimension slightly less than a thickness of the sidewall of the EMI shield. An L-shaped arm also extends upwardly from the base and has a horizontal pick-up tab located at a height above the opposing apexes of the fingers. The pick-up tab provides a surface area for engagement by the head of a pick and place machine which does not have to penetrate the pocket of the carrier tape to remove the same. After the clip is fixed to the PC board, the lower edge of the sidewall of the EMI shield may first be supported on top of the pick-up tab between diverging upper segments of the opposing fingers to facilitate proper location of the EMI shield. The shield and its sidewall are then pressed downwards to deflect and permanently bend the pick-up tab downwards so that its terminal end engages with a notch or a bump in the sidewall to lock the sidewall in position. At the same time the fingers spread apart to allow the sidewall to penetrate between the same, and spring back to grip the sidewall.

Figure 12:
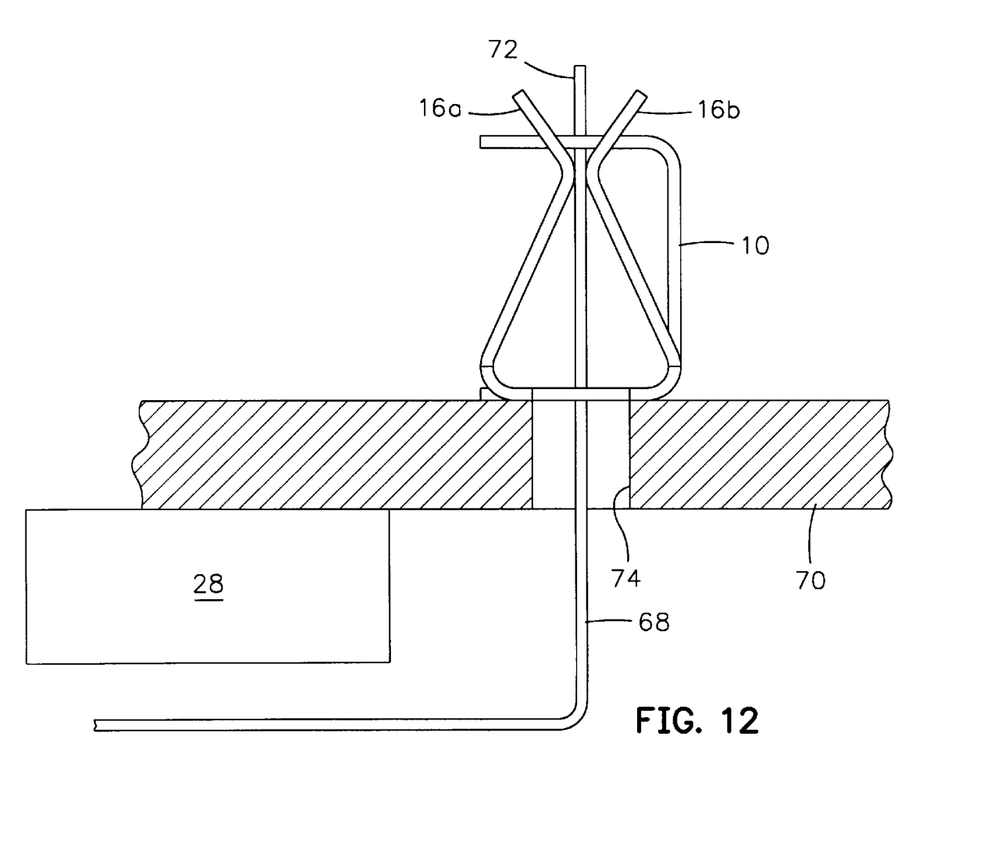
FIG. 12 illustrates a vertical section of PC board and an end elevation view of a clip of the type shown in FIG. 1 surface mounted on the top surface thereof, and the manner in which an EMI shield may be mounted to the underside of the PC board for attachment to the clip via a through hole.

FIG. 12 illustrates an alternate use of the clip 10 that permits a different EMI shield 68 to be mounted on the underside of a PC board 70 so that the clip 10 on the upper side of the PC board can grip and hold a terminal or tab 72 of the shield 68. More specifically, the PC board 70 has a through-hole 74 which permits the tab 72 to extend through the same and through one of the holes 42 (FIG. 1) in the base of the clip 10 so that the tab 72 can be gripped by opposing fingers such as 16a and 16b.

Figure 13:
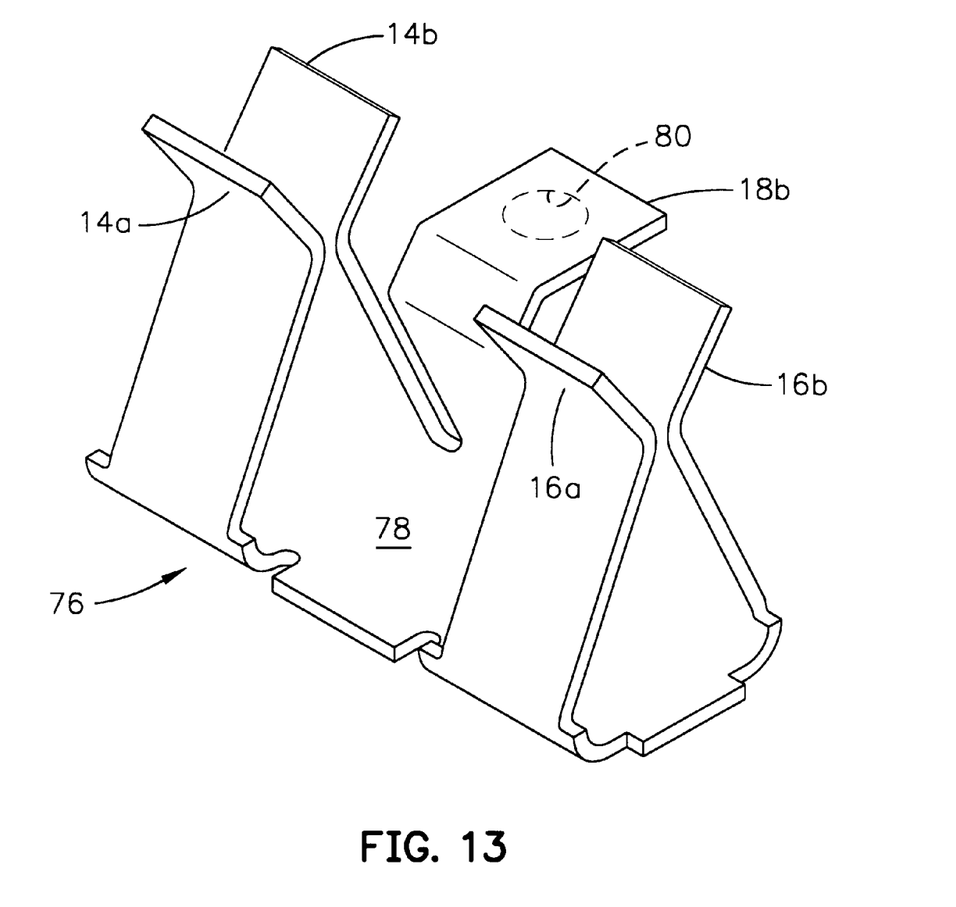
FIG. 13 is an isometric view of an alternate embodiment of the EMI shield clip of the present invention having a pick-up arm that extends outwardly that does not require deflection.

FIG. 13 illustrates an alternate embodiment 76 of the clip of the present invention. It is similar to the clip 10 except that it has a pick-up tab 18b which extends outwardly away from the base 78 of the clip. The base has no holes formed therein. However, the pick-up tab 18b may have a hole 80 formed therein as indicated by the phantom lines.

The alternate embodiment 76 of the clip illustrated in FIG. 13 includes an outwardly projecting pick-up tab 18b which can be gripped by the head of the pick and place machine. However, the clip base 78 does not have a pick-up tab that must be bent or deflected out of position by the sidewall of the clip and therefor the pick-up tab 18b does not create any additional forces required for inserting the sidewall 20 of the shield 22.

Having described preferred embodiments of our new clip for securing an EMI shield to a surface mount printed surface board, it should be apparent to those skilled in the art that our invention may be modified in both arrangement and detail. Therefore, the protection afforded our invention should only be limited in accordance with the scope of the following claims.

We claim:

1. An electronic assembly, comprising:
    a PC board;
    an electronic component mounted on a side of the PC board;
    a plurality of clips mounted on corresponding solder pads on the side of the PC board adjacent the electronic component;
    a shield adjacent the electronic component and attached to the PC board by the clips; and
    each clip comprising a base soldered to the side of the PC board, two pairs of opposing fingers squeezing opposite surfaces of a sidewall of the shield, and an arm extending between the two pairs of fingers away from the base, the arm having a pick-up tab providing a flat surface extending substantially parallel to the base and deflectable toward the base upon insertion of the sidewall between the pairs of fingers.

2. The electronic assembly of claim 1 wherein the sidewall of the shield has a notch formed therein into which a terminal end of the pick-up tab is registered when the pick-up tab is deflected by insertion of the sidewall between the pairs of opposing fingers.

3. The electronic assembly of claim 1 wherein the sidewall of the shield has a bump formed thereon against which a terminal end of the pick-up tab is registered when the pick-up tab is deflected by insertion of the sidewall between the pairs of opposing fingers.

4. A clip for attaching a structure to a substrate, comprising:

a base;

two pairs of resilient opposing fingers extending upwardly in a first direction from the base; and an arm having a first leg extending upwardly in the first direction from the base between the pairs of fingers and a downwardly deflectable second leg providing a flat pick-up tab extending in a second direction substantially orthogonal to the first direction.

5. The clip of claim 4 wherein the fingers have an identical shape.

6. The clip of claim 5 wherein the fingers are substantially V-shaped and define opposing apexs.

7. The clip of claim 4 wherein the pick-up tab extends in the second direction at an intermediate level between the base and a set of terminal ends of the two pairs of opposing fingers.

8. The clip of claim 4 wherein the base has at least one hole formed therethrough.

9. The clip of claim 4 wherein the clip is stamped from sheet metal and folded to provide a unitary structure.

10. The clip of claim 4 wherein the arm is substantially L-shaped.

11. The clip of claim 4 wherein the two pairs of opposing fingers are substantially V-shaped, each pair of fingers define a set of opposing apexes, and the arm is generally L-shaped.

12. The clip of claim 11 wherein the pick-up tab extends in the second direction at an intermediate level between the base and a set of terminal ends of the two pairs of opposing fingers.

* * * * *